(12) United States Patent
Wu et al.

(10) Patent No.: US 10,381,094 B2
(45) Date of Patent: Aug. 13, 2019

(54) 3D MEMORY WITH STAGED-LEVEL MULTIBIT PROGRAMMING

(71) Applicant: MACRONIX INTERNATIONAL CO., LTD., Hsinchu (TW)

(72) Inventors: Chen-Jun Wu, Changhua (TW);
Chih-Chang Hsieh, Hsinchu (TW);
Tzu-Hsuan Hsu, Chiayi (TW);
Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 27 days.

(21) Appl. No.: 15/290,376

(22) Filed: Oct. 11, 2016

(65) Prior Publication Data
US 2018/0102177 A1    Apr. 12, 2018

(51) Int. Cl.
| | |
|---|---|
| *G11C 16/34* | (2006.01) |
| *G11C 16/04* | (2006.01) |
| *G11C 11/56* | (2006.01) |
| *G11C 16/10* | (2006.01) |

(52) U.S. Cl.
CPC ....... *G11C 16/3427* (2013.01); *G11C 11/5628* (2013.01); *G11C 16/0483* (2013.01); *G11C 16/3413* (2013.01); *G11C 16/10* (2013.01); *G11C 2211/562* (2013.01); *G11C 2211/5648* (2013.01)

(58) Field of Classification Search
CPC ............ G11C 11/5628; G11C 16/3427; G11C 16/0483; G11C 16/3413
USPC .......................... 365/185.02, 185.17, 185.05
See application file for complete search history.

(56) References Cited

U.S. PATENT DOCUMENTS

| | | |
|---|---|---|
| 6,996,004 B1 | 2/2006 | Fastow et al. |
| 7,057,934 B2 | 6/2006 | Krishnamachari et al. |
| 7,136,304 B2 | 11/2006 | Cohen et al. |
| 7,177,199 B2 | 2/2007 | Chen et al. |
| 7,411,830 B2 | 8/2008 | Takeuchi et al. |

(Continued)

OTHER PUBLICATIONS

Hsieh, Chih-Chang, et al, :Study of the interference and disturb mechanisms of split-page 3D vertical gate (VG) NAND flash and optimized programming algorithms for multi-level cell (MLC) storage, 2013 Symposium on VLSI Technology (VLSIT), pp. T156,T157, Jun. 11-13, 2011.

(Continued)

*Primary Examiner* — Alexander Sofocleous
*Assistant Examiner* — Alfredo Bermudez Lozada
(74) *Attorney, Agent, or Firm* — Haynes Beffel & Wolfeld LLP

(57) ABSTRACT

A two-sided, staged programming operation is applied to a memory having first and second stacks of memory cells $C1(i)$ and $C2(i)$, i being the physical level of a cell. The staged programming operation includes applying a preliminary program stage S1, an intermediate program stage S2, and a final program stage S3 to memory cells in the first and second stacks. In a programming order the final program stage S3 is applied to memory cells in the first and second stacks at each level (i) for which the intermediate program stage S2 has already been applied to the memory cells in any neighboring levels (levels i+1 and i−1). The intermediate program stage S2 is applied only to memory cells for which the preliminary program stage S1 has already been applied to the cells in any neighboring levels (levels i+1 and i−1).

13 Claims, 12 Drawing Sheets

(56) References Cited

U.S. PATENT DOCUMENTS

| | | | |
|---|---|---|---|
| 7,433,241 | B2 | 10/2008 | Dong et al. |
| 7,440,322 | B2 | 10/2008 | Kamei |
| 7,447,068 | B2 | 11/2008 | Tsai et al. |
| 7,450,430 | B2 | 11/2008 | Hemink et al. |
| 7,457,166 | B2 | 11/2008 | Hemink et al. |
| 7,463,531 | B2 | 12/2008 | Hemink et al. |
| 7,468,918 | B2 | 12/2008 | Dong et al. |
| 7,522,457 | B2 | 4/2009 | Hemink et al. |
| 7,701,775 | B2 | 4/2010 | Kang |
| 7,773,429 | B2 | 8/2010 | Jeon et al. |
| 8,026,544 | B2 | 9/2011 | Ito et al. |
| 8,194,461 | B2 | 6/2012 | Kosaki et al. |
| 8,274,838 | B2 | 9/2012 | Dutta et al. |
| 8,278,170 | B2 | 10/2012 | Lee et al. |
| 8,441,858 | B2 | 5/2013 | Sarin et al. |
| 8,503,213 | B2 | 8/2013 | Chen et al. |
| 8,588,003 | B1 | 11/2013 | Weingarten et al. |
| 8,605,507 | B2 | 12/2013 | Liu et al. |
| 8,630,115 | B2 | 1/2014 | Pascucci et al. |
| 8,638,608 | B2 | 1/2014 | Lai et al. |
| 8,681,563 | B1 | 3/2014 | Lee et al. |
| 8,792,263 | B2 | 7/2014 | Tanzawa |
| 8,830,757 | B2 | 9/2014 | Kito |
| 8,958,249 | B2 | 2/2015 | Dutta et al. |
| 8,982,626 | B2 | 3/2015 | Dong et al. |
| 8,982,637 | B1 | 3/2015 | Dong et al. |
| 9,269,445 | B1 * | 2/2016 | Abe ........................ G11C 16/10 |
| 9,361,991 | B1 * | 6/2016 | Ng ........................ G11C 11/5628 |
| 2004/0153621 | A1 | 8/2004 | Polansky et al. |
| 2004/0174748 | A1 | 9/2004 | Lutze et al. |
| 2005/0219896 | A1 | 10/2005 | Chen et al. |
| 2005/0248988 | A1 | 11/2005 | Guterman et al. |
| 2005/0248989 | A1 | 11/2005 | Guterman et al. |
| 2005/0276108 | A1 | 12/2005 | Guterman |
| 2006/0120165 | A1 | 6/2006 | Hemink |
| 2006/0221709 | A1 | 10/2006 | Hemink et al. |
| 2006/0279990 | A1 | 12/2006 | Wan et al. |
| 2008/0013360 | A1 | 1/2008 | Hemink et al. |
| 2008/0019164 | A1 | 1/2008 | Hemink et al. |
| 2008/0084751 | A1 | 4/2008 | Li et al. |
| 2008/0084752 | A1 | 4/2008 | Li et al. |
| 2008/0089133 | A1 | 4/2008 | Ito |
| 2008/0101126 | A1 | 5/2008 | Hemink et al. |
| 2008/0117683 | A1 | 5/2008 | Hemink |
| 2008/0117684 | A1 | 5/2008 | Hemink |
| 2008/0123436 | A1 | 5/2008 | Byeon |
| 2008/0266978 | A1 | 10/2008 | Goda |
| 2009/0003054 | A1 | 1/2009 | Hung et al. |
| 2009/0010064 | A1 | 1/2009 | Nazarian |
| 2009/0027959 | A1 | 1/2009 | Lee |
| 2010/0014349 | A1 | 1/2010 | Mokhlesi |
| 2010/0074025 | A1 | 3/2010 | Park et al. |
| 2010/0097863 | A1 | 4/2010 | Kim et al. |
| 2010/0128523 | A1 | 5/2010 | Yip |
| 2010/0321998 | A1 | 12/2010 | Jang |
| 2011/0058424 | A1 | 3/2011 | Goda et al. |
| 2011/0134702 | A1 | 6/2011 | Imondi et al. |
| 2011/0286269 | A1 | 11/2011 | Pascucci et al. |
| 2011/0292724 | A1 | 12/2011 | Kim |
| 2012/0092931 | A1 | 4/2012 | Edahiro |
| 2012/0163080 | A1 | 6/2012 | Shalvi et al. |
| 2012/0182802 | A1 | 7/2012 | Hung et al. |
| 2012/0182806 | A1 | 7/2012 | Chen et al. |
| 2013/0301352 | A1 | 11/2013 | Shim et al. |
| 2014/0112075 | A1 | 4/2014 | Dunga et al. |
| 2014/0133209 | A1 | 5/2014 | Buyuktosunoglu et al. |
| 2014/0198570 | A1 | 7/2014 | Hsieh et al. |
| 2014/0198576 | A1 | 7/2014 | Hung et al. |
| 2014/0211565 | A1 | 7/2014 | Song et al. |
| 2014/0250266 | A1 | 9/2014 | Avila et al. |
| 2014/0269057 | A1 | 9/2014 | Shereshevski et al. |
| 2014/0362641 | A1 | 12/2014 | Dong et al. |
| 2015/0263016 | A1 | 9/2015 | Cha |
| 2015/0371703 | A1 | 12/2015 | Lei et al. |
| 2016/0078949 | A1 | 3/2016 | Abe et al. |
| 2016/0098319 | A1 | 4/2016 | Gorobets |
| 2016/0099070 | A1 | 4/2016 | Jiang et al. |
| 2016/0260733 | A1 | 9/2016 | Lue |

OTHER PUBLICATIONS

Johnson, Mark, et al., "512-Mb PROM With a Three-Dimensional Array of Diode/Antifuse Memory Cells," IEEE J. of Solid-State Circuits, vol. 38, No. 11, Nov. 2003, 1920-1928.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Li, et al. 128Gb 3b/Cell NAND Flash Memory in 19nm Technology with 18MB/s Write Rate and 400Mb/s Toggle Mode, 2012 IEEE International Solid-State Circuits Conference, Feb. 19-23, 2012, 2 pages.

Suh et al., "A 3.3 V 32 Mb NAND Flash Memory with Incremental Step Pulse Programming Scheme," Solid-State Circuits Conference, 1995. Digest of Technical Papers. 41st ISSCC, Feb. 15-17, 1995 IEEE International, pp. 128-129 and 350.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Trinh et al., "A 5.6MB/s 64Gb 4b/Cell NAND Flash memory in 43nm CMOS," 2009 IEEE Int'l Solid-State Circuits Conference—Digest of Technical Papers, San Francisco, CA, Feb. 8-12, 2009, 40 pages including Visual Supplement.

\* cited by examiner

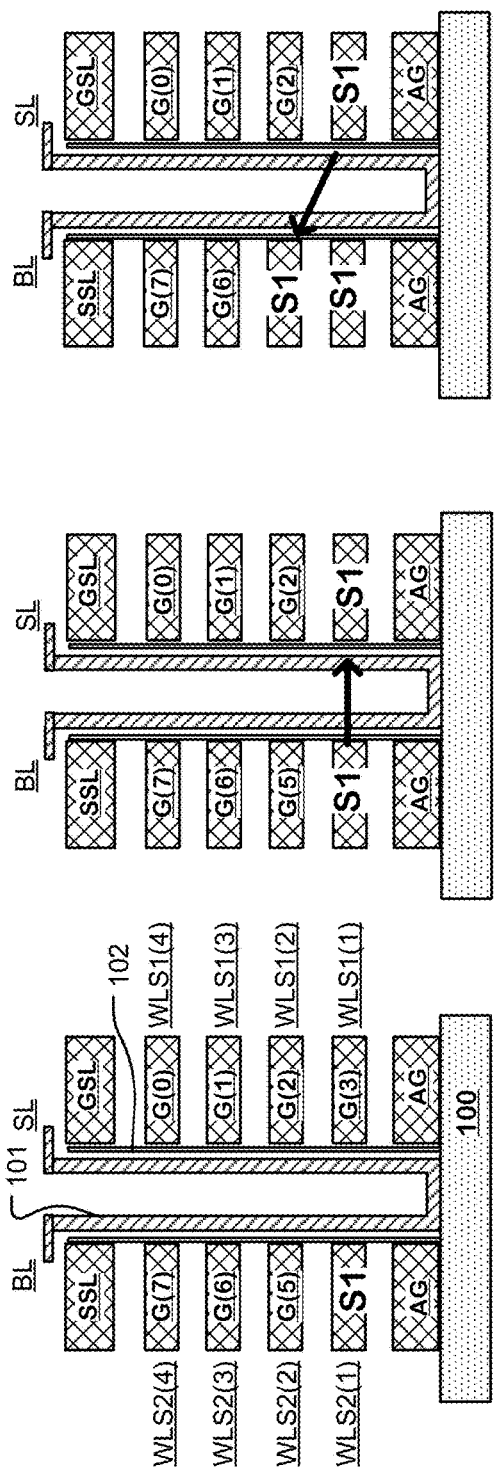
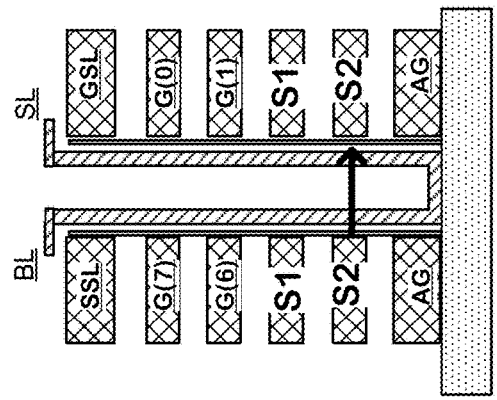
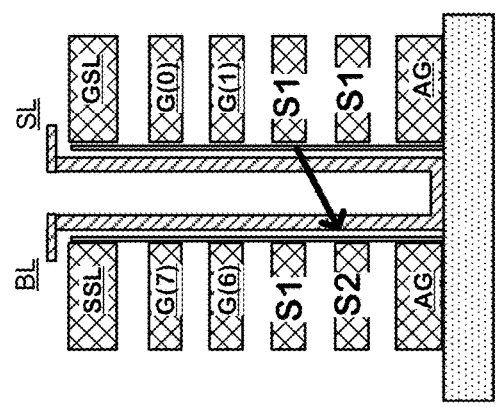
Fig. 10A
Fig. 10B
Fig. 10C
Fig. 10D
Fig. 10E
Fig. 10F

3D MEMORY WITH STAGED-LEVEL MULTIBIT PROGRAMMING

BACKGROUND OF THE INVENTION

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical U-shaped NAND memory, using silicon-oxide-nitride-oxide-silicon SONOS charge trapping technology to create a storage site at each gate/vertical channel interface. The memory structure is based on a U-shaped semiconductor line arranged as the vertical channel for the NAND gate, with a string select gate on an upper level of one leg of the U-shaped semiconductor, and a ground select, or source side select gate on an upper level of the other leg of the U-shaped semiconductor. A plurality of horizontal word lines is formed using planar word line layers that intersect with the each leg of the U, forming a so-called gate-all-around the cell at each layer on each leg.

This U-shaped NAND structure has stacks of memory cells, such as memory cells on each leg of the U, which are disposed in very close proximity. Other 3D memory structures have stacks of memory cells that are very close to one another as well. Disturbance from electric field and thermal fields that are induced for programming and erasing a given cell can arise from cells in the same stack, and from cells in adjacent stacks in these dense structures.

Katsumata et al. has suggested that the structure can be implemented using multiple-bit-per-cell programming technologies. These multiple-bit-per-cell programming technologies require fine control over threshold voltages, making read and program disturb characteristics even more critical. Therefore, even with high density three-dimensional flash technologies, the density of data storage can be limited.

It is desirable to provide a structure for three-dimensional integrated circuit memory with a low manufacturing cost, including reliable, very small memory elements, and high data densities, and to provide technologies for reducing program and erase disturb issues.

SUMMARY

A two-sided, staged programming operation for a 3D memory device, such as a 3D NAND flash with U-shaped NAND strings, has an order based on the physical levels of the cells and is applied to pairs of closely spaced stacks of cells. The memory has a first stack of memory cells $C1(i)$ and a second stack of memory cells $C2(i)$, in a plurality of levels where i is an index indicating a level of a cell in the stack, and i goes from 1 to N. The staged programming operation includes applying a preliminary program stage S1, an intermediate program stage S2, and a final program stage S3 to memory cells in the first and second stacks according to a programming order.

The programming order is arranged so that the final program stage S3 is applied to memory cells on the first and second stacks at each level (i) for which the intermediate program stage S2 has already been applied to the memory cells in any neighboring levels (levels i+1 and i−1) of the first and second stacks. Also, the intermediate program stage S2 can be applied only to memory cells for which the preliminary program stage S1 has already been applied to the cells in any neighboring levels (levels i+1 and i−1) of the first and second stacks.

A memory device is described including circuitry to implement the programming operation.

Other aspects and advantages of the present invention can be seen on review of the drawings, the detailed description and the claims, which follow.

DETAILED DESCRIPTION

Figure 1:
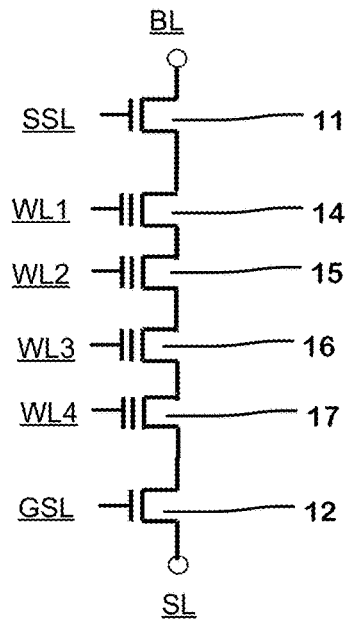
FIG. 1 is a simplified schematic circuit diagram of a flash memory NAND string according to the prior art.

A detailed description of embodiments of the present invention is provided with reference to the FIGS. 1-13. FIG. 1 is a circuit diagram of a basic 2D flash NAND string. The NAND string comprises memory cell transistors in series between a bit line BL and a source line SL. A first switch consisting of transistor 11 connects the string to the bit line in response to a signal on a string select line SSL. A second switch consisting of transistor 12 connects the string on the opposite end to the source line in response to a signal on a ground select line GSL. Memory cells 14, 15, 16, 17 are arranged in series between the first and the second switches. Of course there can be a larger number of memory cells in a given string.

When storing multiple bits per cell in a memory cell in a NAND string, bias arrangements are applied which control the amount of charge trapped in the charge trapping structures of the target memory cells, to set the threshold level of the target cell at a level that corresponds to the particular data. A memory cell storing three bits of data for example will be configured to set the threshold level in eight ranges to represent the eight possible combinations of three bits in the memory cell. In order to store multiple bits per cell it is necessary to precisely control the threshold voltage distributions for each memory state.

For multiple-bits-per-cell NAND strings, incremental step pulsed programming ISPP has been developed, which involves applying program pulses to the word line of a selected cell, with corresponding biasing of the source side and bit line side of the selected NAND strings to induce charge tunneling, followed by a threshold verify step with a retry if the verify step does not pass. The magnitude of the program pulses is incrementally stepped or otherwise changed through the pulse/verify cycles until the target threshold voltage is achieved in the memory cell. The ISPP allows for precise control over the threshold voltage ranges achieved. However, for high density NAND there is substantial coupling between the charge storage structures in the memory cells. Thus, as a program operation is applied across an array, the threshold voltages of memory cells are disturbed by programming of neighboring cells. This results in spreading of the threshold voltage distributions in the memory cells, and less read margin. Similar programming procedures involving program pulse/verify cycles are applied in other types of memory as well, including programmable resistance memory.

One approach to reduce disturbance due to programming in neighboring cells, called three-step programming TSP algorithm, has been developed to reduce the spreading of the threshold voltage distributions in flash memory.

Figure 2:
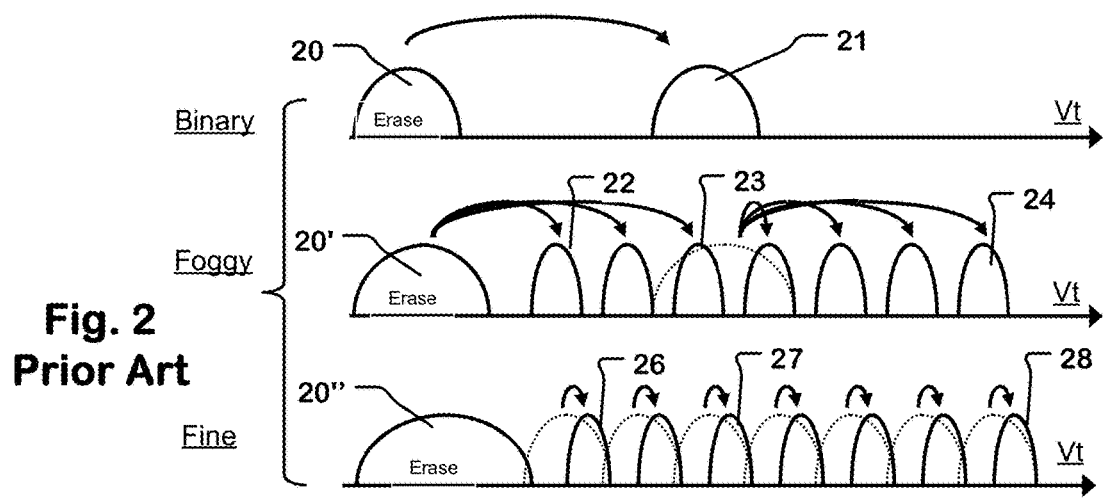
FIG. 2 is a set of charts illustrating threshold voltage distributions for memory cells at the three stages of a so-called three step programming method, according to the prior art.

FIG. 2 illustrates three stages of a program operation including a "binary" stage which results in a binary threshold voltage distribution state as shown in the top graph, a "foggy" stage which results in a foggy multilevel threshold voltage distribution state as shown in the middle graph, and a "fine" stage which results in a fine multilevel threshold voltage distribution state as shown in the bottom graph.

The program operation has a programming sequence which first applies the binary stage, in which cells are first pre-erased, and a programming operation is applied with a single verify threshold. Memory cells in the array that are not to be programmed remain in the erased state and have threshold voltage in distribution 20 after the binary stage of the operation. Memory cells in the array, that are to receive the program pulses, have threshold voltage increased into a second distribution 21 as a result of the binary stage of the programming operation.

Next, the programming sequence applies the foggy stage, in which cells that remain in the erased state stay in the slightly broadened distribution 20', and cells to be programmed to the first three program levels have their threshold voltage boosted from the erased distribution 20 to one of the intermediate distributions, such as distribution 22 or distribution 23. The cells that were initially in the distribution 21 after the binary stage have their threshold voltage increased into the higher-level distributions, such as distribution 24. This can be accomplished using an ISPP sequence using seven threshold levels needed to establish the seven upper distributions, or other algorithms. The sequence applied in this intermediate stage can use relatively large increments in magnitude for each pulse/verify cycle so that the operation can occur relatively quickly with a smaller number of pulse/verify cycles. However, the larger increments in magnitude result in relatively broad threshold voltage ranges for the states that result from applying the intermediate stage.

Last, the programming sequence applies the fine stage. In the fine stage, the memory cells are adjusted into fine state with narrower threshold voltage distributions and wider margins. Thus, the memory cells in the distribution 22 in the foggy state may have their threshold levels tightened into the distribution 26 in the fine state. Likewise, the memory cells in the distribution 23 of the foggy state may have their threshold voltage tightened into the distribution 27 in the fine state. Likewise, the memory cells in the threshold voltage distribution 24 may have their threshold voltage tightened into the distribution 28 in the fine state.

In general, the distribution states shown in FIG. 2 illustrate an example of an operation used to program multiple bits of data per memory cell.

Figure 3:
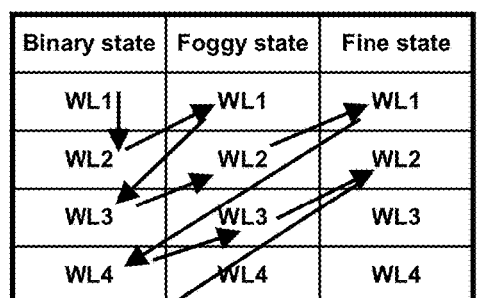
FIG. 3 is a table illustrating a programming sequence for applying the three-stage method to a NAND string according to the prior art.

To reduce the disturbance that might occur during the process, the order of the program stages among the elements of the NAND string can be controlled as shown in FIG. 3. FIG. 3 is a table illustrating the program stage for a four word line NAND string, such as shown in FIG. 1. The sequence includes first applying a binary stage operation on word line WL1 to cause the memory cells to adopt a binary state. Next, the binary stage operation is applied to word line WL2. Then, in sequence, the foggy stage is applied to word line WL1, the binary stage is applied to word line WL3; the foggy stage is applied to word line WL2, the fine stage is applied to word line WL1.

This TSP technology is described for example in Li, et al., "128 Gb 3b/Cell NAND Flash Memory in 19 nm Technology with 18 MB/s Write Rate and 400 Mb/s Toggle Mode", IEEE International Solid-State Circuits Conference, 2012.

As new memory structures are developed, the techniques developed for the TSP programming are not able to resolve cell-to-cell disturbance during programming operations in some new technologies. For example, 3D technologies using U-shaped NAND strings remain subject to significant distribution spreading because of disturbance, even applying TSP because the physical configuration of the memory cells results in more complex coupling of the program voltages.

Figure 4:
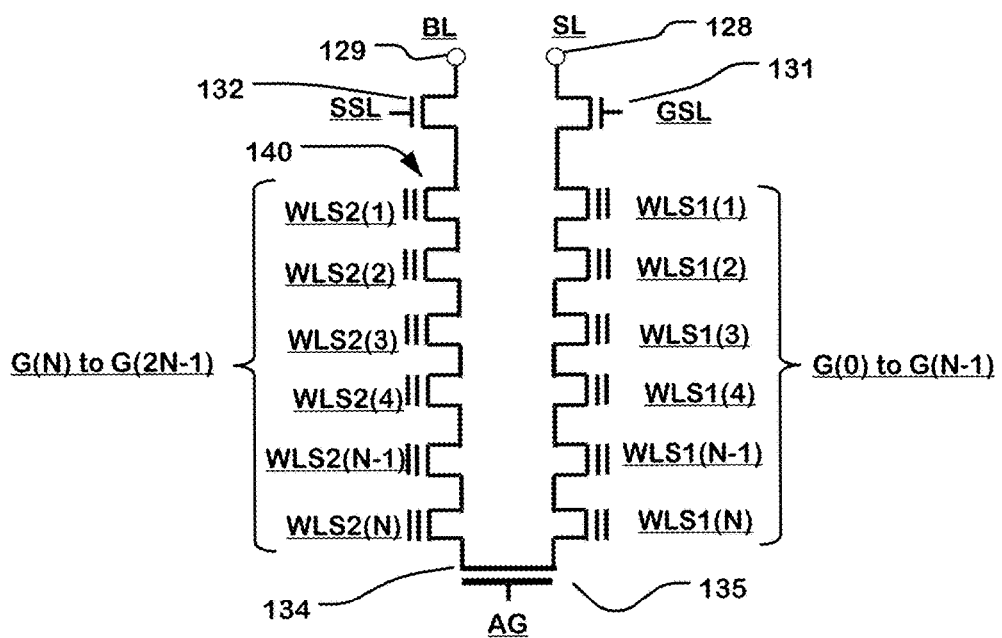
FIG. 4 is a schematic circuit diagram of a U-shaped NAND string on a single active pillar in a 3D NAND structure.

A circuit schematic for a U-shaped NAND string is shown in FIG. 4. The U-shaped NAND string is a series of flash memory cells connected between a string select switch 132

(sometimes called a drains side switch) connected to a bit line contact 129 and ground select switch 131 (sometimes called a source side switch) connected to a common source line contact 128. The U-shaped NAND string is disposed vertically in 3D structures, and has two stacks of cells on the channel lines on the two sides, designated first and second stacks in this description. An upper level in the first stack in this example includes a ground select line GSL which acts as a gate for a first switch 131 in the NAND string, and an upper level in the second stack includes a string select line SSL which acts as a gate for a second switch 132 in the same NAND string. Intermediate levels in the stack include word lines, where the word lines in the first stack include word line WLS1(1) to word line WLS1(N), where the index 1 to N represents the relative physical level in the stack of the word lines, and the word lines in the second stack include word line WLS2(1) to word line WLS2(N). At the bottom 134 of the U-shaped NAND string, the channel lines (also called local bit lines) are electrically connected, such as being formed by a single continuous film. Although it may be omitted in some embodiments, an assist gate structure 135 is included in the illustrated embodiment which is coupled by a gate dielectric to the channel line in the bottom of the stack. The assist gate structure 135 can be used to induce an inversion region that improves the conductivity of the channel line between the first and second sides. The word lines in NAND strings act as gates for the memory cells in the string, and are typically numbered by an index going from 0 to one less than the number of cells in the string. In this case, the U-shaped string has 2N cells where N is the number of levels, and the word lines can be labeled G(0) to G(2N−1). The word lines on the first side include gates G(0) to G(N−1). The word lines on the second side include gates G(N) to G(2N−1).

Figure 5:
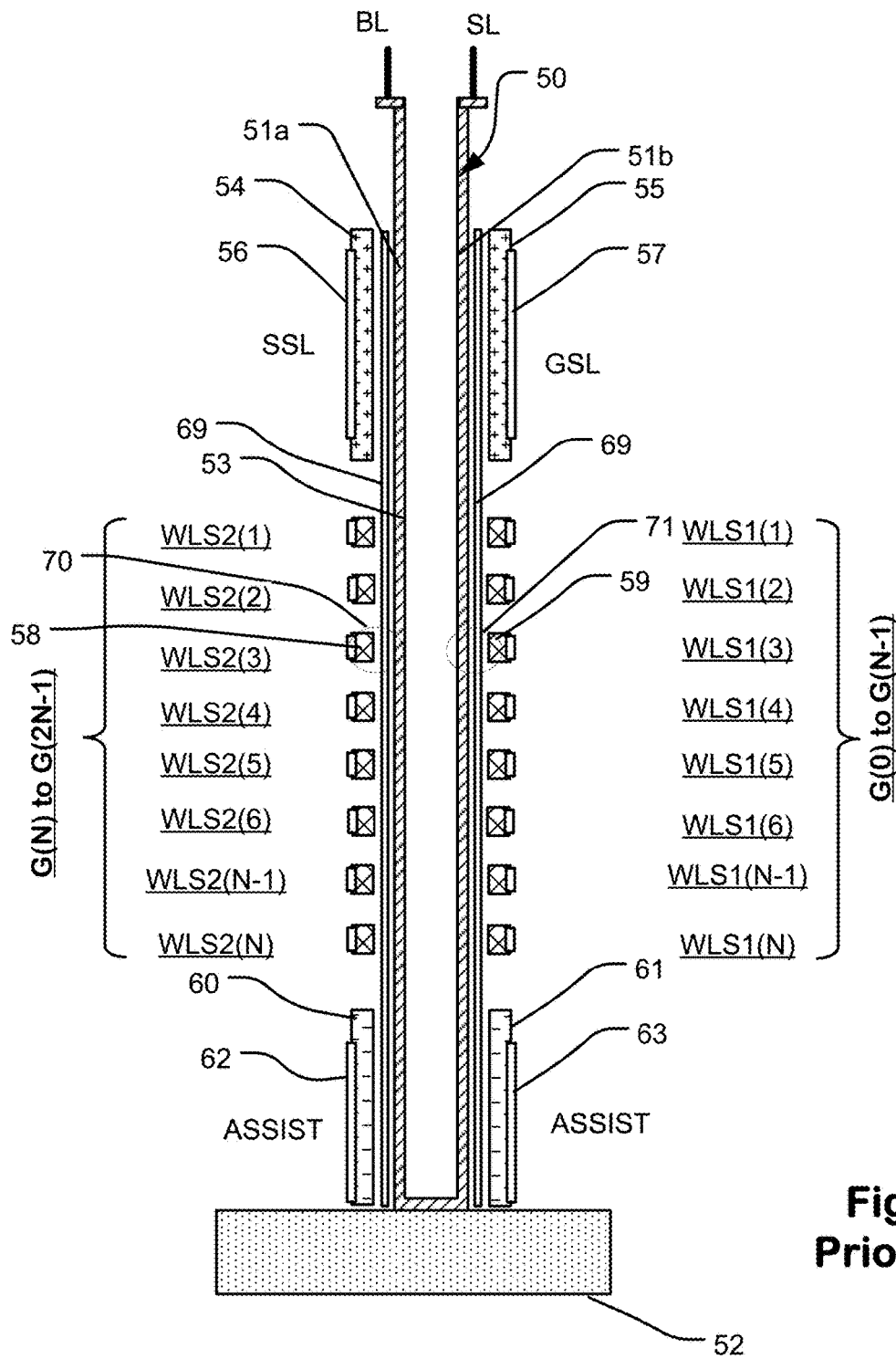
FIG. 5 is a heuristic cross-section of an active pillar with a U-shaped vertical channel NAND string in a 3D memory device.

FIG. 5 is a cross-section of an active pillar implementing a U-shaped NAND string as shown in FIG. 4. Details concerning the structure and manufacture of a U-shaped NAND string can be seen in commonly owned, and co-pending U.S. patent application Ser. No. 14/637,204, filed 3 Mar. 2015, entitled U-Shaped Vertical Thin-Channel Memory, which is incorporated by reference as if fully set forth herein. The active pillar in FIG. 5 includes a vertical channel structure 50, which includes a vertical polysilicon semiconductor body, including even and odd thin-channel films separated by a seam 53 along the length of the pillar, and is electrically connected at the bottom of the pillar over an insulating substrate layer 52. A charge storage element 69 is disposed on each side of the pillar. The vertical channel structure 50 includes a portion 51a providing a channel body for a string select line transistor on one side and a portion 51b providing a channel body for a ground select line transistor on the other side. Between the portions 51a, 51b and the bottom of the vertical channel structure, the seam is disposed within the vertical channel structure 50 between the first and second stacks of word lines.

In the structure of FIG. 5, memory cells are disposed at the cross points of the word lines and the vertical channel structure. For example, at the level at which word line strips 58 and 59 cross the vertical channel structure 50, memory cells 70 and 71 are disposed in the first and second stacks. The memory cells 70 and 71 are independently gated by signals on the word line strips 58 and 59, respectively.

FIG. 5 illustrates conductive strips 54 and 55, configured as a string select line SSL and a ground select line GSL, respectively, both in the upper level of the stacks of conductive strips. The select line conductive strips 54 and 55 can include a more highly conductive film 56, 57 on the outside surfaces, such as a film of a metal silicide.

FIG. 5 also illustrates assist gate lines 60 and 61 which can be implemented as conductive strips in the stacks including the word lines. The assist gate lines 60, 61 can include more highly conductive films 62, 63 on the outside surfaces, such as a film of metal silicide.

Likewise, conductive strips are disposed as first and second stacks of word lines on opposing sides of the vertical channel structure 50. The first stack of word lines includes word lines WLS1(1) to WLS1(N). The second stack of word lines includes word lines WLS2(1) to WLS2(N). Thus, conductive strip 59 is word line WLS1(3) at level 3 in the first stack. Conductive strip 58 is word line WLS2(3) at level 3 in the second stack. N word line levels, where N is 8 in this example, are illustrated. Of course, a different number of word line levels, such as 16, 32, or more can be utilized.

As illustrated in FIG. 5, word lines may also include silicide films or other more highly conductive films (e.g. 62) on the outside surfaces.

In other embodiments, all or some of the string select lines, word lines and ground select lines are implemented using metal, or other conductive material, rather than polysilicon.

The structure illustrated in FIG. 5 provides memory cells 70, 71 having independent charge storage sites on the odd and even sides of the vertical channel structure 50. Also, the structure provides a single U-shaped NAND string extending along the opposing sides of the vertical channel structure 50.

A reference line structure, such as a line in a patterned metal layer, can be arranged orthogonally over the stacks of conductive strips and connected to the active pillar at the contact SL (source line) for biasing through the source side switch. A bit line structure, such as a line in a patterned metal layer, can be arranged orthogonally over the even and odd stacks of conductive strips and connected to the active pillar at the contact BL for biasing through the drain side switch, and for connecting selected NAND strings to sense amplifiers. The bit line structure and the reference line structure can be disposed in the same patterned conductor layer or different patterned conductor layers.

Figure 6:
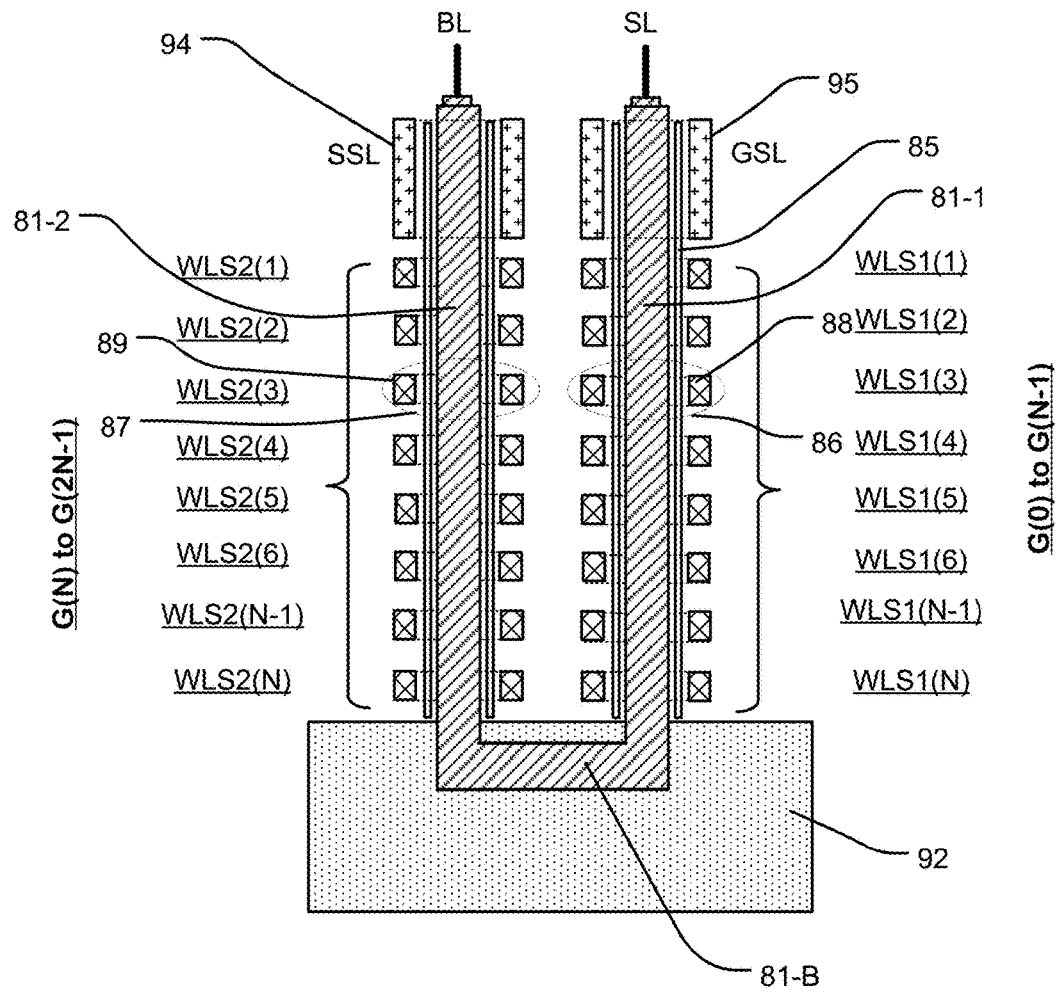
FIG. 6 is a heuristic cross-section of an alternative structure for a U-shaped vertical channel NAND string in a 3D memory device with gate-all-around GAA word lines.

FIG. 6 illustrates another embodiment of a U-Shaped NAND memory, representative of structures described in U.S. Patent Application Pub. No. US 2015/0263016, filed 6 Aug. 2014 by Cha, entitled Semiconductor Device; and in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. FIG. 6 is a cross-section of a U-shaped NAND string formed using two pillars 81-1 and 81-2 which are coupled together at the bottom by conductor 81-B which is disposed through an insulating substrate 92. Each active pillar 81-1 and 81-2 acts as the vertical channel structure for first and second stacks of word lines. The word lines are so-called "all-around gates" so that in cross-section portions of word line 88 (WLS1(3)) and of word line 89 (WLS2(3)) are seen on both sides of the pillars 81-1 and 81-2, with the pillars 81-1 and 81-2 penetrating the word lines. A charge storage element 85 is disposed between the word lines and the pillars. Memory cells (e.g. cells 86, 87) are therefore formed at the cross points of the word lines and the pillars. The word lines WLS1(1) to WLS1(N) in the first stack act as gates G(0) to G(N−1) for the NAND string. The word lines WLS2(1) to WLS2(N) in the second stack act as gates G(N) to G(2N−1) for the NAND string. At the top of the pillar 81-1 a conductive line 95 configured as a ground select line GSL is disposed to form a switch for connection of the NAND string to the source line SL. At the top of the pillar 81-2 a conductive line 94 configured as a string select line SSL is disposed to form a switch for connection of the NAND string to the bit line BL. In some embodiments, an assist structure may be implemented to improve conduction in the conductor 81-B.

Figure 7:
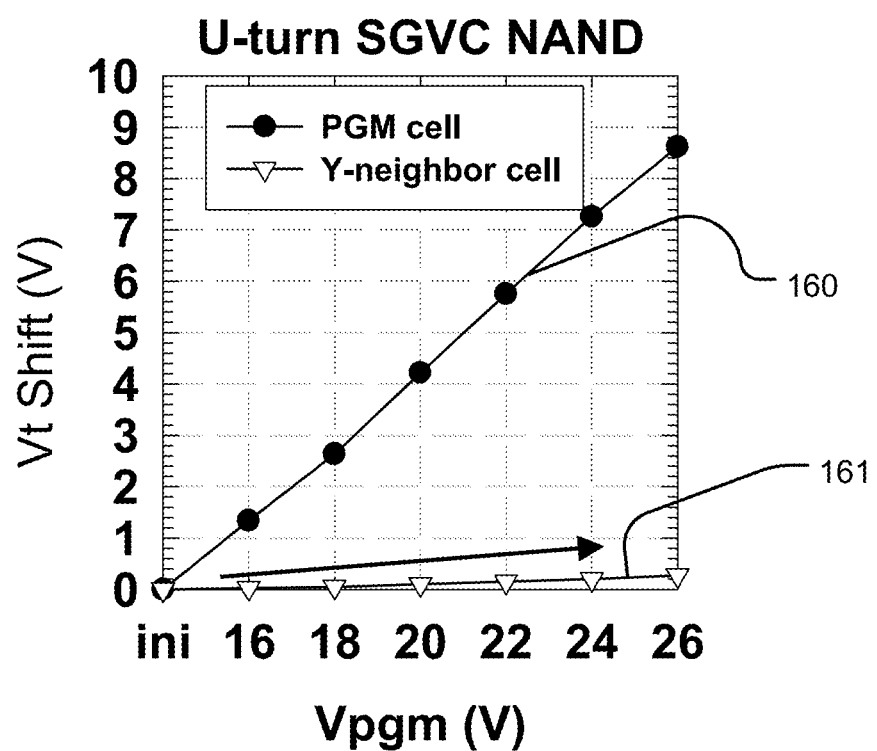
FIG. 7 is a graph of program voltage for program pulses versus change in threshold voltage for target and neighbor cells in a U-shaped NAND string.
Figure 9:
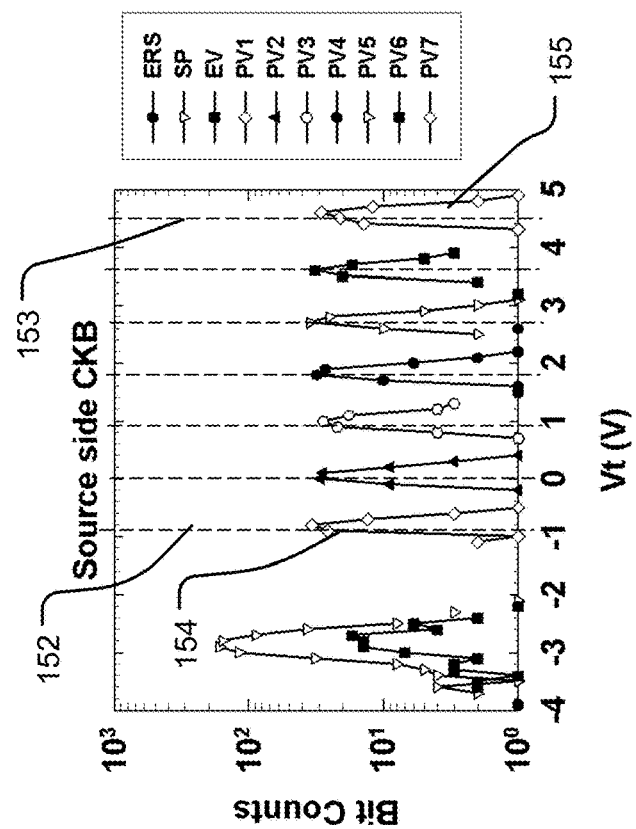
FIGS. 8 and 9 are graphs of threshold voltage versus cell count, showing threshold voltage distributions after a "checkerboard" program pattern, for a prior art U-shaped NAND string on the drain side and the source side of the string after a prior art program operation.
Figure 8:
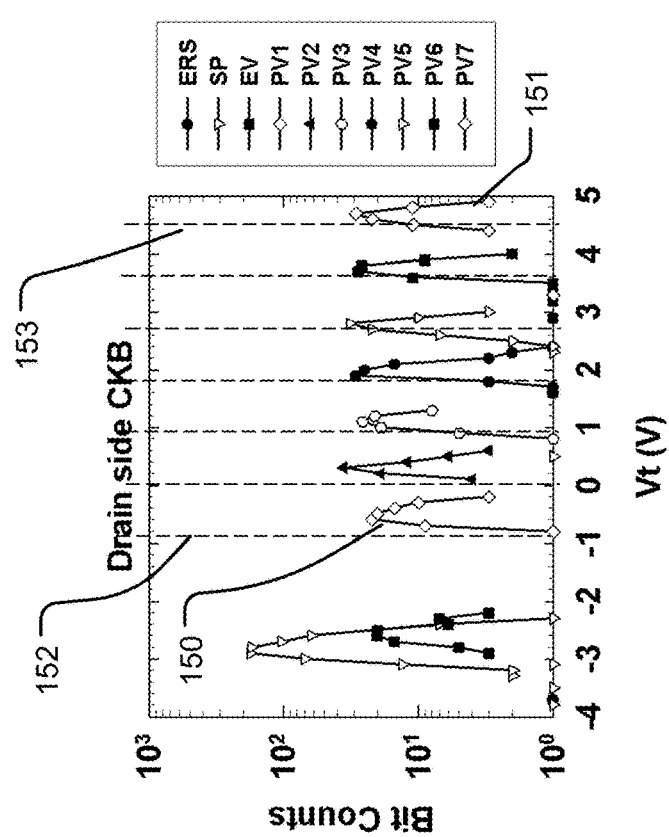

FIG. 7 is a chart of change in threshold voltage versus program pulse magnitude in a U-shaped NAND string for a programmed cell on trace 160, and cells on the same level of the neighboring WL stack on trace 161. The data is based on the U-shaped (or U-turn) NAND string structure of FIG. 5, having a single gate, vertical channel SGVC structure. The chart shows that as the program pulse magnitude increases, during a program operation that may involve a sequence of such pulses, the threshold voltage on the cells on the same level of the adjacent stack in the Y-direction can increase by as much as 0.3 V in this example FIGS. 8 and 9 illustrate threshold voltage distributions for a three-bit memory cell which results from the prior art three-step program operation discussed with reference to FIGS. 2 and 3. The data represent the threshold voltage distributions for a program operation in which the drain side of the U-shaped NAND string was programmed first and the source side was programmed last.

In the Figures, the trace ERS represents the distribution after the erase operation. The trace SP represents the distribution after a soft program cycle after the erase. The trace EV represents the distribution of non-programmed cells, after the programming operation. The traces PV1 to PV7 represent the distributions for memory cells programmed to the seven program verify levels PV1 to PV7 for the three-bit memory cell.

In FIG. 8, the distributions for memory cells on the drain side are charted. Reference is made for example to the trace 150 for PV1 near the reference line 152 at about negative 0.9 V, and the trace 151 for PV7 near the reference line 153 at about positive 4.5 V.

FIG. 9 charts the distributions for memory cells on the source side which were programmed last in the sequence. Reference is made to the trace 154 for PV1 near the reference line 152 at about −0.9 V, and the trace 155 for PV7 near the reference line 153 at about +4.5 V. Looking at the chart, it is seen that the distributions represented by traces 150 and 151 for the drain side memory cells are shifted and broadened relative to the distributions represented by traces 154 and 155 for the source side memory cells.

This shift and broadening of the distributions is believed to result from disturbance of the threshold voltages on the drain side cells, that occurs when the neighboring source side cells are programmed. This shows that the three-step programming operation is less effective for dense 3D memory.

As can be seen in the structures of FIG. 5 and FIG. 6, the memory cells in a U-shaped NAND string are disposed with very high density so that a program operation on a particular cell, such as the cell 86 in FIG. 6, can cause disturbance of charge stored in memory cells above and below on the same stack of cells on pillar 81-1, and can cause disturbance of charge stored in memory cells (including memory cell 87) in the stack of cells on the adjacent pillar 81-2. The disturbance can broaden the threshold voltage distributions for memory cells in the memory device. These broadened threshold voltage distributions make it difficult to implement 3D multiple bits per cell memories with vertically stacked memory cells.

An improved programming operation for arrays of stacked memory cells with very high and increasing densities, such as arrays of U-shaped NAND strings, is described here which can reduce disturbance of the final threshold voltage distribution states of neighboring cells.

The program operation comprises staged multibit programming for a 3D memory, in which the stages are applied to two stacks of cells, and according to the level of the target cells in the stack.

The staged programming operation includes a preliminary stage S1, which in this example is the binary stage dividing the memory cells into two threshold voltage distributions. In other embodiments, the preliminary stage S1 may involve more than two threshold voltage distributions. The preliminary stage S1 operates to establish preliminary threshold levels to be used in later sequences that divide the threshold levels into the target ranges for the multiple bits per cell. The preliminary stage can involve pulse magnitudes that are relatively large or that cause relatively large threshold voltage changes, in order to move the threshold voltages quickly above an intermediate threshold level.

The operation includes an intermediate program stage S2, which in this example is the foggy stage. The intermediate stage S2 can be a multilevel sequence S2 serves to divide the memory cells into a greater number of threshold voltage distributions than the preliminary sequence S1, and in this example to the same number of threshold voltage distributions as will be achieved in the final stage S3. The intermediate sequence can involve pulse magnitudes that are smaller than those applied in the preliminary sequence, because the amount of movement of the threshold levels is reduced relative to the preliminary sequence.

The operation includes a final program stage S3, which in this example is the fine stage. The final program stage S3 establishes the final threshold voltage distributions, with good read margins. The final sequence can involve pulse magnitudes that are even smaller than those applied in the intermediate sequence, because of the small threshold voltage changes to be induced.

As described herein, the staged programming is applied in coordination with level decoding, so that the sequence is not applied in conventional word line order from the source line to bit line or vice versa. Rather, the staged programming is applied according to two adjacent stacks according to the level in the stack of the target cell for a particular stage, and the completed programming stages of cells in neighbor levels both above and below the target cell.

Figure 10H:
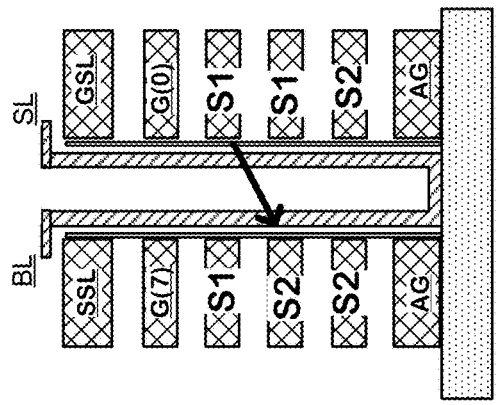
FIGS. 10A to 10X illustrate a programming order for a two-sided staged programming operation as described herein.
Figure 10K:
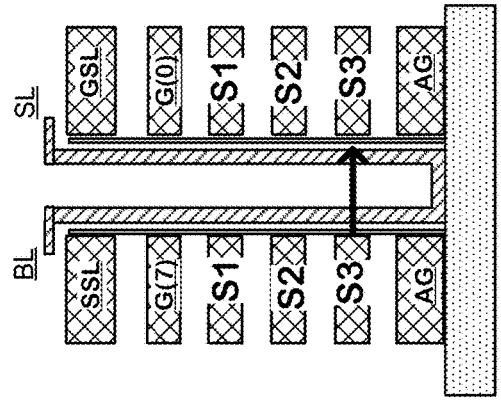
Figure 10I:
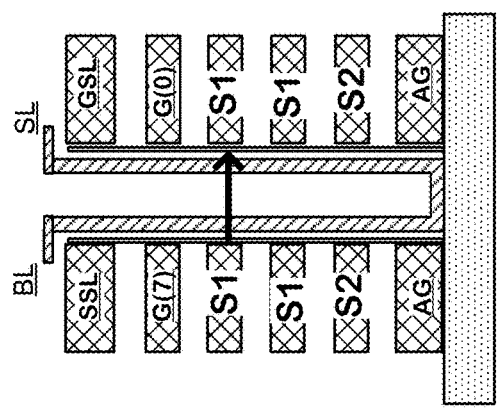
Figure 10L:
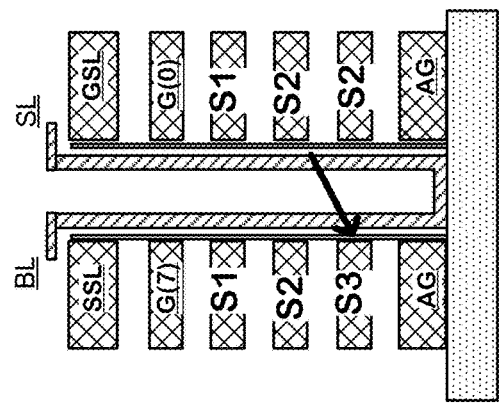
Figure 10G:
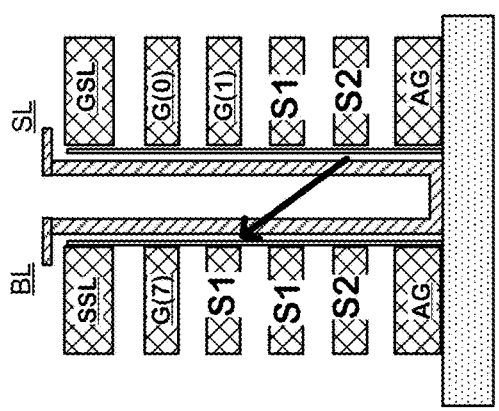
Figure 10J:
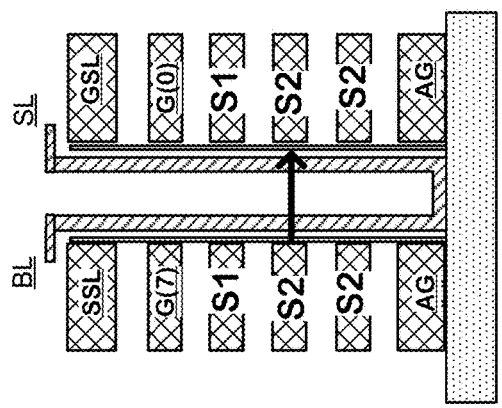
Figure 10M:
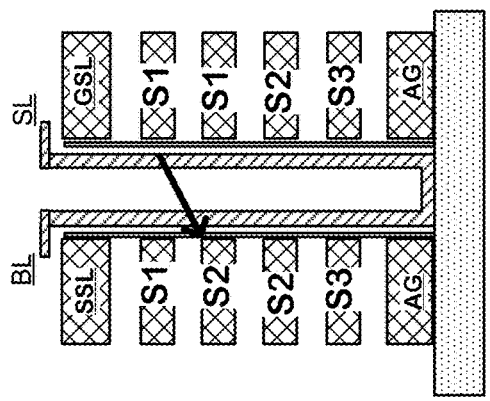
Figure 10P:
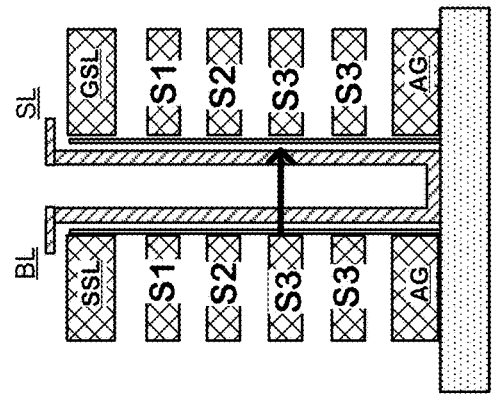
Figure 10N:
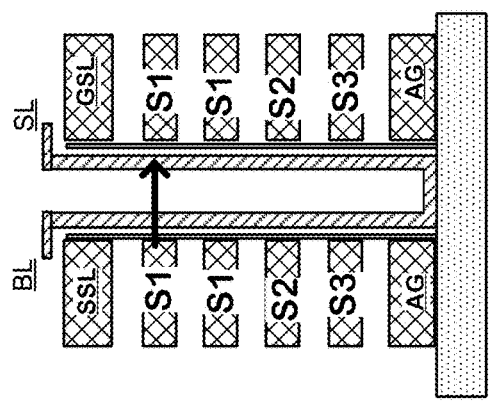
Figure 10Q:
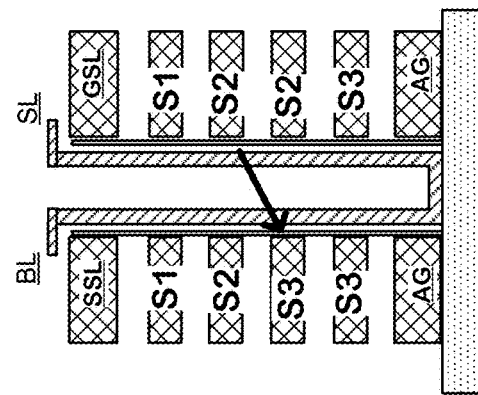
Figure 10O:
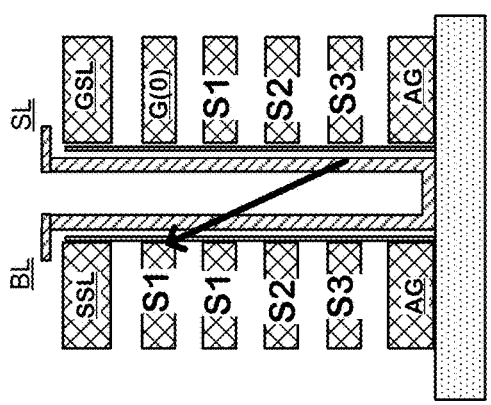
Figure 10R:
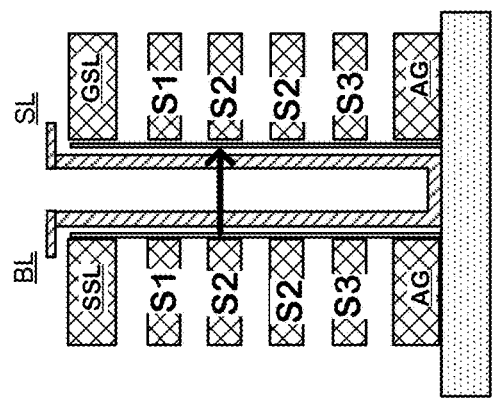
Figure 10S:
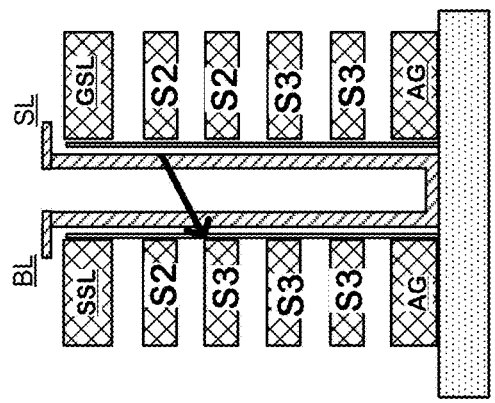
Figure 10V:
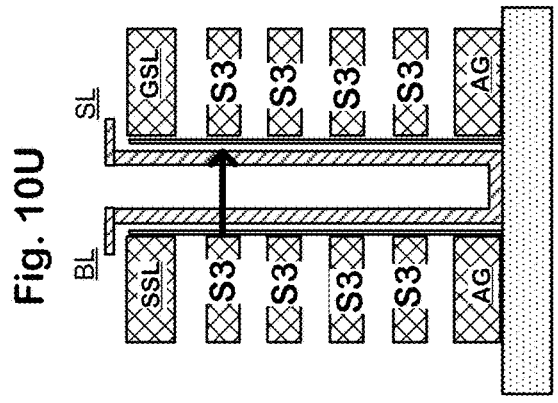
Figure 10T:
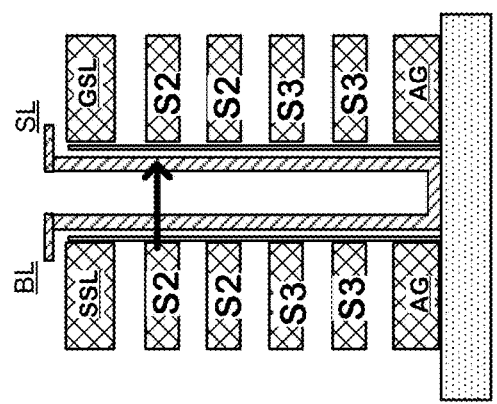
Figure 10W:
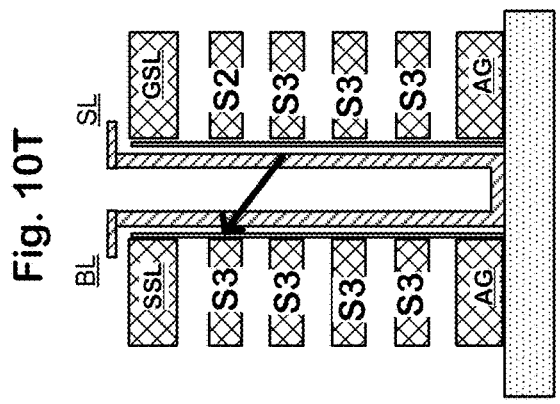
Figure 10U:
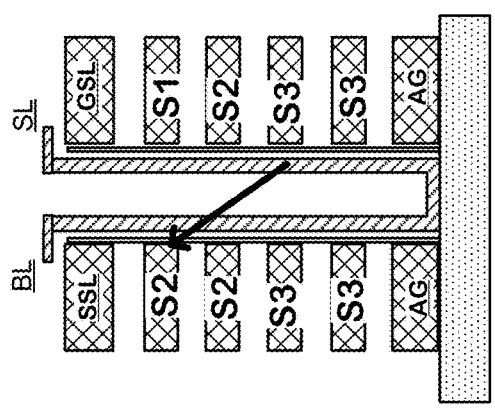
Figure 10X:
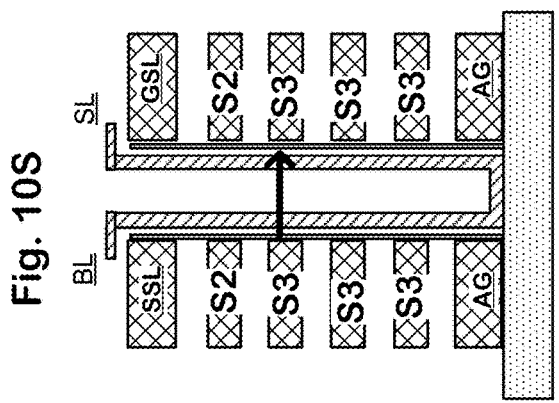

FIGS. 10A through 10X illustrate a two-sided, three-stage program operation to store three bits per cell in two stacks of memory cells, including a preliminary program stage S1, an intermediate program stage S2 and the final program stage S3, such as the binary, foggy and fine stages discussed above.

In some embodiments, the number of stages applied in the programming operation can be greater than three, such that there are a preliminary stage, a final stage and a plurality of intermediate stages.

In each of the FIGS. 10A through 10X, a structure including stacked memory cells is shown. In the embodiment used for this description, the stacked memory cells are arranged as a U-shaped NAND string. The structure illustrated is formed on a substrate 100, which can be an insulating material, and has a channel line 101 disposed along the sides of word lines in the stack. The channel line 101 includes a first vertical channel line disposed along the sides of the first stack of word lines, and connected to a source line SL, and a second vertical channel line disposed along the sides of the second stack of word lines and connected to a bit line BL. The first and second vertical channel lines are connected by an electrical connection for current flow between the first and second vertical channel lines at the bottom. As a result of the electrical connection, the memory cells on the sidewalls, and the first and second stacks word lines, are arranged in electrical series and can be configured as a single NAND string.

A charge storage structure 102 is disposed on the channel line 101 at least in locations adjacent to the sidewalls of the word lines. The charge storage structure 102 can comprise a floating gate structure with a tunnel dielectric, a polysilicon floating gate, and a blocking dielectric. Alternatively, the charge storage structure 102 can comprise a dielectric charge trapping structure, with a tunnel dielectric, a dielectric charge trapping layer, and a blocking layer.

The structure includes SSL and GSL gates at the top level, a first stack of word lines WLS1(i) and a second stack of word lines WLS2(i). An assist gate at the bottom below the stack of word lines is illustrated. The four levels of word lines include a first stack of word lines WLS1(i) and a second stack of word lines WLS2(i), where i is an index indicating a level of a word line in the first and second stacks, and i goes from 1 to N (N=4 in this example). To generalize the programming order, such that it can start either at the top of the stacks, or at the bottom of the stacks, level N is one of the upper-most level and the lower-most level in the first and second stacks. In FIGS. 5 and 6, N is the level of the lower-most word line at the bottom of the stack. For description of the sequence, an embodiment in which N is the level of the upper-most word line at the top of the stack as shown in FIGS. 10A to 10X.

With four levels, the stacks includes eight separate word lines acting as gates G(0) to G(7) for an eight-cell NAND string, with the index 0 to 7 corresponding with typical addressing schemes starting with address 0, for labeling the gates.

The programming order described with reference to FIGS. 10A through 10X is configured so that the final program stage S3 is applied to memory cells in the first and second stacks at each level (i) in the stacks for which the intermediate program stage S2 has already been applied to the memory cells on word lines in any neighboring levels (levels i+1 and i−1) of the first and second stacks, and so that the intermediate program stage S2 is applied only to memory cells for which the preliminary program stage S1 has already been applied to the cells on word lines in any neighboring levels (i+1 and i−1).

The programming order can be characterized as including:
(a) selecting word lines WLS1(i) and WLS2(i), for i=1, and applying program stage S1;
(b) selecting word lines WLS1(i+1) and WLS2(i+1) and applying program stage S1 (The index i is the level of the selected cell in the previous programming step. In this case i+1=2.);
(c) selecting word lines WLS1(i−1) and WLS2(i−1) and applying program stage S2;
(d) selecting word lines WLS1(i+2) and WLS2(i+2) and applying program stage S1;
(e) selecting word lines WLS1(i−1) and WLS2(i−1) and applying program stage S2;
(f) selecting word lines WLS1(i−1) and WLS2(i−1) and applying program stage S3;
(g) selecting word lines WLS1(i+3) and WLS2(i+3) and applying program stage S1;
(h) selecting word lines WLS1(i−1) and WLS2(i−1) and applying program stage S2;
(i) selecting word lines WLS1(i−1) and WLS2(i−1) and applying program stage S3;
(j) repeating (g), (h) and (i) until i+3 in step (i) is greater than N, then selecting WLS1(N) and WLS2(N) and applying program stage S2;
(k) selecting word lines WLS1(N−1) and WLS2(N−1) and applying program stage S3; and
(l) selecting word lines WLS1(N) and WLS2(N) and applying program stage S3. (Level N can be the top level or the bottom level). In the example shown with reference to FIGS. 10A through 10X, N is the top of the stack, and level 1 is the bottom of the stack.)

The staged-level multibit program operation can be understood with respect to the example shown in FIGS. 10A through 10X, in which the order in which each stage S1, S2, S3 is applied is shown with corresponding labels on the target locations in order.

FIG. 10A shows that stage S1 is applied to the cell at WLS2(1) at the bottom level (level 1) of the stack in the first step of the example sequence.

FIG. 10B shows the next step, in which stage S1 is applied to the cell at WLS1(1) in the same level (level 1) of the stack. As mentioned above, this sequence begins at the bottom of the stack (i.e. where the bottom level is labeled level 1) but could also be applied beginning at the top of the stack (i.e. where the top level would be labeled level 1).

FIG. 10C shows that after applying the first stage S1 to both memory cells at level 1, the word line in the next level in the stack is selected, and stage S1 is applied to the cell at WLS2(2) at level 2 of the stack.

FIG. 10D shows the next step, in which stage S1 is applied to the cell at WLS1(2) in the same level (level 2) of the stack.

FIG. 10E shows that after applying the first stage S1 to both memory cells in level 2, the word line in the second stack in the previous level (i−1) of the stack is selected, and the intermediate stage S2 is applied to the cell at WLS2(1) at level 1 of the stack.

FIG. 10F shows that stage S2 is applied to the cell at WLS1(1) in the next step. Thus, the intermediate stage S2 is applied to memory cells in level 1 for which the preliminary program stage S1 had already be applied to the cells on word lines in the two stacks in any neighboring level (level 1 with no underlying level at this point of the sequence).

FIG. 10G shows that after applying the second stage S2 to the memory cells at level 1, the word line WLS2(3) at two levels above level 1 (level i+2) in the second stack is selected, and the first stage S1 is applied.

FIG. 10H shows that after applying the stage S1 to the memory cell at word line WLS2(3), stage S1 is applied to the memory cell in the first stack in the same level on word line WLS1(3).

FIG. 10I shows that after applying the first stage S1 to both memory cells in level 3, the word line in the second stack in the previous level (i−1) of the stack is selected, and the intermediate stage S2 is applied to the cell at WLS2(2) at level 2 of the stack for which the preliminary program stage S1 had already be applied to the cells on word lines in in the two stacks any neighboring level.

FIG. 10J shows that stage S2 is applied to the cell at WLS1(2) in the next step. Thus, the intermediate stage S2 is applied to memory cells in level 2 for which the preliminary program stage S1 had already been applied to the cells on word lines in the neighboring levels (level 1 and level 3).

FIG. 10K shows that after applying the second stage S2 to both memory cells in level 2, the word line in the second stack in the previous level (i−1) of the stack is selected, and the final stage S3 is applied to the cell at WLS2(1) at level 1 of the stack for which the preliminary program stage S1 and the intermediate program stage S2 had already be applied to the cells on word lines in the two stacks in any neighboring level (level 1 with no underlying level at this point of the sequence).

FIG. 10L shows that stage S3 is applied to the cell at WLS1(1) in the next step. Thus, the final stage S3 is applied to memory cells in level 1 for which the preliminary program stage S1 and the intermediate program stage S2 had already been applied to the cells on word lines in any neighboring level (level 2).

FIG. 10M shows that after applying the final stage S3 to the memory cells at level 1, the word line WLS2(4) at three levels above level 1 (level i+3) in the second stack is selected, and the first stage S1 is applied.

FIG. 10N shows that after applying the stage S1 to the memory cell at word line WLS2(4), stage S1 is applied to the memory cell in the first stack in the same level on word line WLS1(4).

FIG. 10O shows that after applying the first stage S1 to both memory cells in level 4, the word line in the second stack in the previous level (i−1) of the stack is selected, and the intermediate stage S2 is applied to the cell at WLS2(3) at level 3 of the stack.

FIG. 10P shows that stage S2 is applied to the cell at WLS1(3) in the next step. Thus, the intermediate stage S2 is applied to memory cells in level 3 for which the preliminary program stage S1 had already been applied to the cells on word lines in the neighboring levels (level 2 and level 4).

FIG. 10Q shows that after applying the second stage S2 to both memory cells in level 3, the word line in the second stack in the previous level (i−1) of the stack is selected, and the final stage S3 is applied to the cell at WLS2(2) at level 2 of the stack.

FIG. 10R shows that stage S3 is applied to the cell at WLS1(2) in the next step. Thus, the final stage S3 is applied to memory cells in a level for which the preliminary program stage S1 and the intermediate program stage S2 had already been applied to the cells on word lines in any neighboring level (levels 1 and 3).

In general, the process steps described with respect to FIGS. 10M and 10R are repeated until the index i+3 is greater than N. In that case, the first stage S1 will have already been applied to the top level of the stack, and the sequence shown in FIGS. 10S and 10T is performed.

FIG. 10S shows that for a four-level stack in which a three-stage programming operation is applied, after applying the final stage S3 to the memory cells at level 2, the word line WLS2(4) is selected, and the second stage S2 is applied.

FIG. 10T shows that after applying the stage S2 to the memory cell at word line WLS2(4), stage S2 is applied to the memory cell in the first stack in the same level on word line WLS1(4).

FIG. 10U shows that after applying the second stage S2 to both memory cells in level 4, the word line in the second stack in the previous level (i−1) of the stack is selected, and the final stage S3 is applied to the cell at WLS2(3) at level 3 of the stack.

FIG. 10V shows that stage S3 is applied to the cell at WLS1(3) in the next step. Thus, the final stage S3 is applied to memory cells in level 3 for which the preliminary stage S1 and the intermediate stage S2 had already been applied to the cells on word lines in the neighboring levels (level 2 and level 4).

FIG. 10W shows that after applying the third stage S3 to both memory cells in level 3, the word line in the second stack in the level (N) of the stack is selected, and the final stage S3 is applied to the cell at WLS2(4) at level 4 of the stack.

FIG. 10X shows that stage S3 is applied to the cell at WLS1(4) in the next step. Thus, the final stage S3 is applied to memory cells in a level for which the preliminary program stage S1 and the intermediate program stage S2 had already been applied to the cells on word lines in any neighboring level (level 3).

Figure 12:
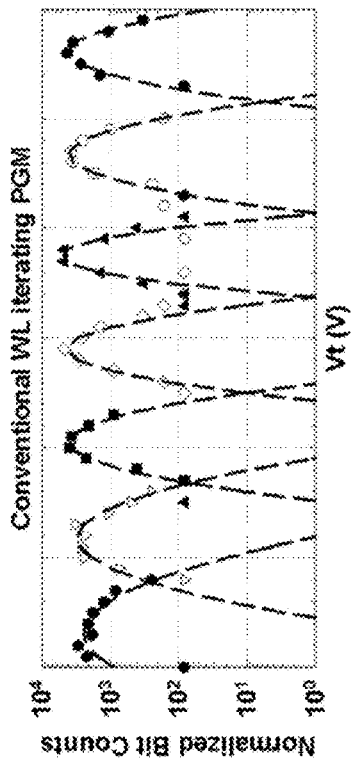
FIGS. 11 and 12 are graphs of threshold voltage versus cell count, contrasting threshold voltage distributions after a "checkerboard" program pattern, for a two-sided staged program operation as described herein and a prior art program operation for a U-shaped NAND string.
Figure 11:
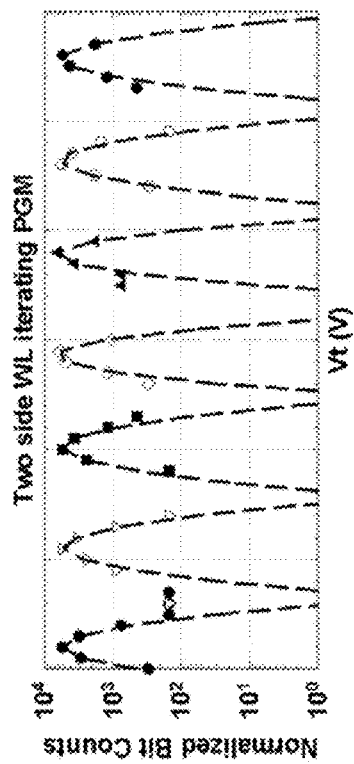

FIG. 11 shows a normalized threshold voltage distribution resulting from the improved algorithm, described with reference to FIGS. 10A through 10X, while FIG. 12 shows the normalized distribution resulting from the conventional three-step algorithm. As is apparent from comparing distribution charts, the improved two-sided word line iterating program operation results in much tighter threshold voltage ranges, with good margin. Thus, the technique can be applied to achieve lower cost data storage with multilevel cells in dense three-dimensional structures.

The programming operation can be applied to other 3D memory configurations, in which there are first and second stacks of memory cells adjacent to one another so that interference between cells on adjacent stacks can degrade threshold voltage distributions. In this case, the algorithm of FIGS. 10A to 10X can be generalized, so that the order is based on selecting cells C1(i) in a first stack of cells and cells C2(i) in a second stack of cells.

Figure 13:
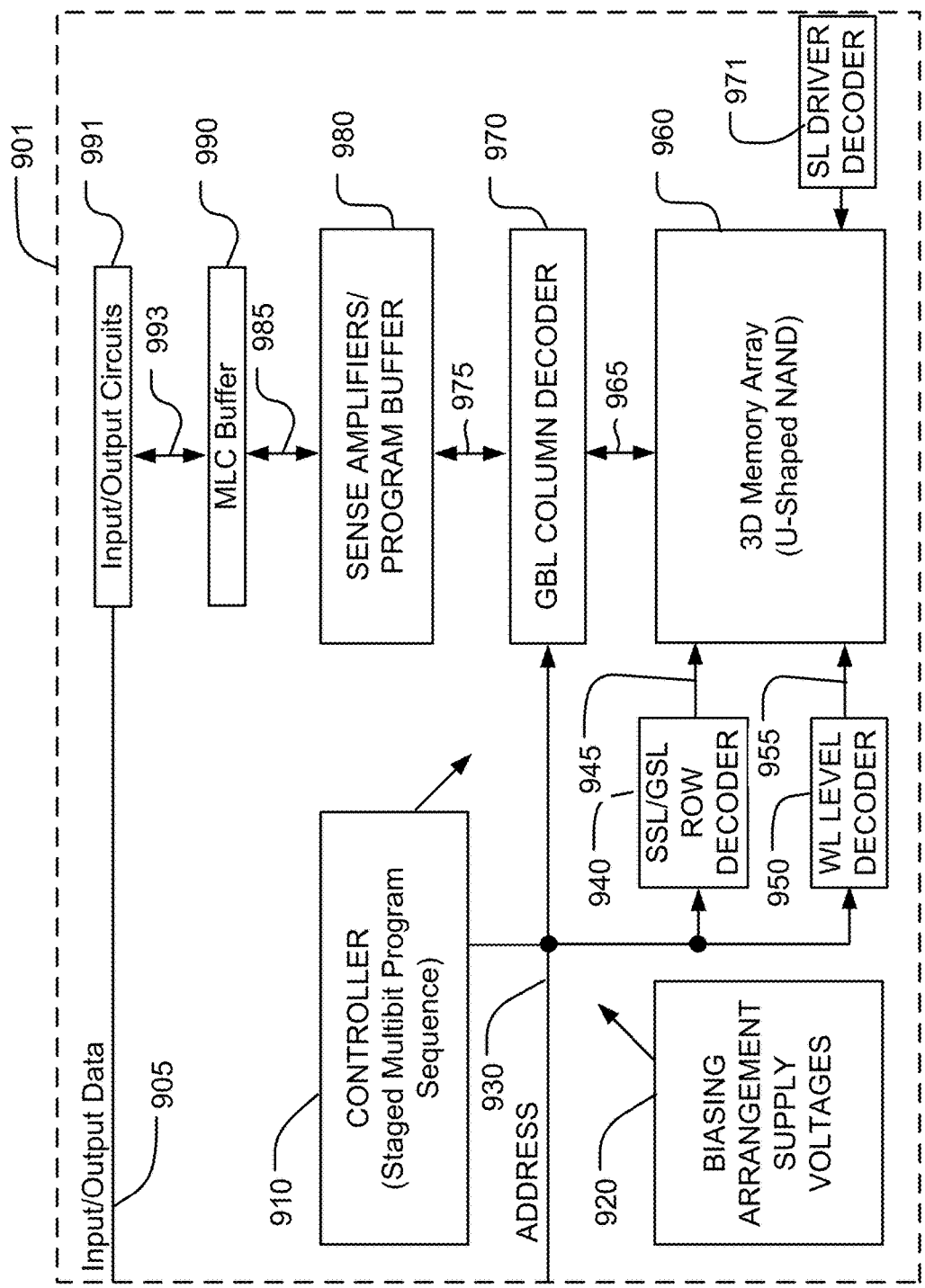
FIG. 13 is a block diagram of an integrated circuit memory including a 3D memory array with U-shaped NAND strings, and two-sided staged programming.

FIG. 13 is a simplified chip block diagram of an integrated circuit 901 including a 3D, U-Shaped NAND array. The integrated circuit 901 includes a 3D memory array 960 which can include for example one or more memory blocks as described herein with U-shaped NAND strings comprising vertical channel cells on an integrated circuit substrate.

An SSL/GSL decoder 940 is coupled to a plurality of SSL/GSL lines 945, arranged in the memory array 960. A word line level decoder 950 is coupled and drives to a plurality of word lines 955 in support of ISPP operations, and other operations. A global bit line column decoder 970 is coupled to a plurality of global bit lines 965 arranged along columns in the memory array 960 for reading data from and writing data to the memory array 960. A source line decoder 971 is coupled to the array, for applying source line bias voltages in support of read, erase and program operations. Addresses are supplied on bus 930 from control logic 910 to decoder 970, decoder 971, decoder 940 and decoder 950. Sense amplifier and program buffer circuits 980 are coupled to the column decoder 970, in this example via first data lines 975. The program buffer circuits 980 can support multiple-level programming, and provide indicators of program or inhibit states for selected bit lines in support of ISPP operations and other types of operations. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which supports triple-bit cells and other multiple-bit cells, which is in turn coupled to input/output circuits 991 via a data path 993. Also, input data is applied in this example to the multi-level data buffer 990 for use in support of multiple-level program operations for cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 13, control logic 910, using a bias arrangement state machine, controls the application of supply voltages generated or provided through the voltage supply or supplies in block 920, such as read, erase, verify and program bias voltages. The control logic 910 is coupled to the multi-level data buffer 990 and the memory array 960. The control logic 910 includes logic to control multiple-level program operations. In embodiments supporting the U-shaped vertical NAND structures described herein, the logic is configured to perform the method of:

selecting a layer of memory cells in the array, such as using a word line layer decoder;

selecting a side of the vertical channel structures in the selected layer such as by selecting an even or odd side word line structure;

selecting vertical channel structures in a selected row in the array such as by using SSL switches and GSL switches on the rows of vertical channel structures; and storing charge in charge trapping sites in the selected layer on the selected side of vertical channel structures in one or more selected columns in the array, to represent data using bit line circuitry like page buffers on global bit lines coupled to the selected row of vertical channel structures.

In embodiments supporting the U-shaped vertical NAND structures, or other stacked memory structures as described herein, the logic is configured to perform the method of staged-level 3D programming as described above in connection with FIGS. 10A through 10X. In one embodiment, for first and second stacks of cells C1($i$) and C2($i$), for i=1 to N, the program order implemented by the logic includes:

(a) selecting cells C1($i$) and C2($i$), for i=1, and applying program stage S1;
(b) selecting cells C1($i$+1) and C2($i$+1) and applying program stage S1 (The index i is the level of the selected cell in the previous programming step. In this case i+1=2.);
(c) selecting cells C1($i$−1) and C2($i$−1) and applying program stage S2;
(d) selecting cells C1($i$+2) and C2($i$+2) and applying program stage S1;
(e) selecting cells C1($i$−1) and C2($i$−1) and applying program stage S2;
(f) selecting cells C1($i$−1) and C2($i$−1) and applying program stage S3;
(g) selecting cells C1($i$+3) and C2($i$+3) and applying program stage S1;
(h) selecting cells C1($i$−1) and C2($i$−1) and applying program stage S2;
(i) selecting cells C1($i$−1) and C2($i$−1) and applying program stage S3;
(j) repeating (g), (h) and (i) until i+3 in step (i) is greater than N, then selecting cells C1(N) and C2(N) and applying program stage S2;
(k) selecting cells C1(N−1) and C2(N−1) and applying program stage S3; and
(l) selecting cells C1(N) and C2(N) and applying program stage S3.

The control logic 910 can be implemented using a state machine for driving the circuits in the device. The state machine can comprise special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device including a plurality of memory cells, comprising:
a NAND string having 2N word lines, the NAND string having a first stack of cells C1($i$) coupled with a first set of N word lines of the 2N word lines, and a second stack of cells C2($i$) coupled with a second set of N word lines of the 2N word lines, where i is an index indicating a level of a cell in the first and second stacks, and i goes from 1 to N, and wherein level N is one of the uppermost level and the lowermost level in the first and second stacks; and
a controller configured to program multiple bits of data per memory cell in the plurality of memory cells, including:
logic to apply a preliminary program stage S1, an intermediate program stage S2, and a final program stage S3 to memory cells in the plurality of memory cells in the first stack and then the second stack; and
logic to select memory cells in the plurality of memory cells according to a programming order in which the final program stage S3 is applied to memory cells in the first stack and then the second stack at each level (i) for which the intermediate program stage S2 has already been applied to the memory cells in any neighboring levels (levels i+1 and i−1) of both the first and second stacks, and for at least one level (i) in the plurality of levels, the final program stage S3 is applied to level (i) of both the first and second stacks before the preliminary program stage Si is applied to level (i+3) of both the first and second stacks.

2. The memory device of claim 1, according to the programming order, the intermediate program stage S2 is applied only to memory cells for which the preliminary program stage Si has already been applied to the cells in any neighboring levels (levels i+1 and i−1) of the first and second stacks.

3. The memory device of claim 1, the programming order including:
(a) selecting cells C1($i$) and C2($i$), for i=1, and applying program stage S1;
(b) selecting cells C1($i$+1) and C2($i$+1) and applying program stage S1;
(c) selecting cells C1($i$−1) and C2($i$−1) and applying program stage S2;
(d) selecting cells C1($i$+2) and C2($i$+2) and applying program stage S1;

(e) selecting cells C1(*i*−1) and C2(*i*−1) and applying program stage S2;
(f) selecting cells C1(*i*−1) and C2(*i*−1) and applying program stage S3;
(g) selecting cells C1(*i*+3) and C2(*i*+3) and applying program stage S1;
(h) selecting cells C1(*i*−1) and C2(*i*−1) and applying program stage S2;
(i) selecting cells C1(*i*−1) and C2(*i*−1) and applying program stage S3;
(j) repeating (g), (h) and (i) until i+3 in step (i) is greater than N, then selecting cells C1(N) and C2(N) and applying program stage S2;
(k) selecting cells C1(N−1) and C2(N−1) and applying program stage S3; and
(l) selecting cells C1(N) and C2(N) and applying program stage S3.

4. The memory device of claim 1, the first and second stacks of cells being disposed on a channel line including a first vertical channel line disposed along sides of a first stack of word lines, a second vertical channel line disposed along sides of a second stack of word lines, and an electrical connection between the first stack and the second stack for current flow between the first and second vertical channel lines.

5. The memory device of claim 4, further including an upper strip over the first stack configured as a gate of a first switch having a channel in the first vertical channel line, and an upper strip over the second stack configured as a gate of a second switch having a channel in the second vertical channel line.

6. An integrated circuit, comprising:
a plurality of U-shaped NAND strings, each U-shaped NAND string including a first stack of word lines WLS1(*i*) on a first side and a second stack of word lines WLS2(*i*) on a second side, where i is an index indicating a level of a word line in the U-shaped NAND string, and i goes from 1 to N, and wherein level N is one of the uppermost level and the lowermost level in the first and second stacks; and
a controller configured to program multiple bits of data per memory cell in the plurality of U-shaped NAND strings, including
logic to apply a preliminary program stage S1, an intermediate program stage S2, and a final program stage S3 to memory cells in the plurality of U-shaped NAND strings on selected word lines in the first side and then the second side; and
logic to select memory cells in the plurality of U-shaped NAND strings, according to a programming order in which the final program stage S3 is applied to memory cells on the first side and then the second side at each level (i) for which the intermediate program stage S2 has already been applied to the memory cells on word lines in any neighboring levels (levels i+1 and i−1) of the first and second sides, and for at least one level (i) in the plurality of levels, the final program stage S3 is applied to level (i) of both the first and second sides before the preliminary program stage Si is applied to level (i+3) of both the first and second sides.

7. The integrated circuit of claim 6, according to the programming order, the intermediate program stage S2 is applied only to memory cells on the first and second sides at each level (i) for which the preliminary program stage Si has already been applied to the cells on word lines in any neighboring levels (levels i+1 and i−1) of the first and second sides.

8. The integrated circuit of claim 6, the programming order including:
(a) selecting word lines WLS1(*i*) and WLS2(*i*), for i=1, and applying program stage S1;
(b) selecting word lines WLS1(*i*+1) and WLS2(*i*+1) and applying program stage S1;
(c) selecting word lines WLS1(*i*−1) and WLS2(*i*−1) and applying program stage S2;
(d) selecting word lines WLS1(*i*+2) and WLS2(*i*+2) and applying program stage S1;
(e) selecting word lines WLS1(*i*−1) and WLS2(*i*−1) and applying program stage S2;
(f) selecting word lines WLS1(*i*−1) and WLS2(*i*−1) and applying program stage S3;
(g) selecting word lines WLS1(*i*+3) and WLS2(*i*+3) and applying program stage S1;
(h) selecting word lines WLS1(*i*−1) and WLS2(*i*−1) and applying program stage S2;
(i) selecting word lines WLS1(*i*−1) and WLS2(*i*−1) and applying program stage S3;
(j) repeating (g), (h) and (i) until i+3 in step (i) is greater than N, then selecting WLS1(N) and WLS2(N) and applying program stage S2;
(k) selecting word lines WLS1(N−1) and WLS2(N−1) and applying program stage S3; and
(l) selecting word lines WLS1(N) and WLS2(N) and applying program stage S3.

9. A method for operating a 3D memory device having a NAND string having 2N word lines, the NAND string comprising a first stack of memory cells C1(*i*) coupled with a first set of N word lines of the 2N word lines and a second stack of memory cells C2(*i*) coupled with a second set of N word lines of the 2N word lines, in a plurality of levels where i is an index indicating a level of a cell in the stack, and i goes from 1 to N, and wherein level N is one of the uppermost level and the lowermost level in the first and second stacks; the method comprising:
applying a preliminary program stage S1, an intermediate program stage S2, and a final program stage S3 to memory cells in the first and second stacks according to a programming order, the programming order being arranged so that the final program stage S3 is applied to memory cells on the first stack and then the second stack at each level (i) for which the intermediate program stage S2 has already been applied to the memory cells in any neighboring levels (levels i+1 and i−1) of the both first and second stacks, and for at least one level (i) in the plurality of levels, the final program stage S3 is applied to level (i) of both the first and second stacks before the preliminary program stage S1 is applied to level (i+3) of both the first and second stacks.

10. The method of claim 9, the programming order being arranged so that the intermediate program stage S2 is applied only to memory cells in the first and second stacks at each level (i) for which the preliminary program stage Si has already been applied to the cells on word lines in any neighboring levels (levels i+1 and i−1) of the first and second stacks.

11. The method of claim 9, the programming order including:
(a) selecting cells C1(*i*) and C2(*i*), for i=1, and applying program stage S1;
(b) selecting cells C1(*i*+1) and C2(*i*+1) and applying program stage S1;
(c) selecting cells C1(*i*−1) and C2(*i*−1) and applying program stage S2;

(d) selecting cells C1($i$+2) and C2($i$+2) and applying program stage S1;
(e) selecting cells C1($i$−1) and C2($i$−1) and applying program stage S2;
(f) selecting cells C1($i$−1) and C2($i$−1) and applying program stage S3;
(g) selecting cells C1($i$+3) and C2($i$+3) and applying program stage S1;
(h) selecting cells C1($i$−1) and C2($i$−1) and applying program stage S2;
(i) selecting cells C1($i$−1) and C2($i$−1) and applying program stage S3;
(j) repeating (g), (h) and (i) until i+3 in step (i) is greater than N, then selecting cells C1(N) and C2(N) and applying program stage S2;
(k) selecting cells C1(N−1) and C2(N−1) and applying program stage S3; and
(l) selecting cells C1(N) and C2(N) and applying program stage S3.

12. The method of claim 9, wherein the memory cells are configured in a U-shaped NAND string, the first set of N word lines including word lines WLS1($i$) for the first stack and the second set of N word lines including word lines WLS2($i$) for the second stack.

13. The method of claim 12, including implementing the programming order by:

(a) selecting word lines WLS1($i$) and WLS2($i$), for i=1, and applying program stage S1;
(b) selecting word lines WLS1($i$+1) and WLS2($i$+1) and applying program stage S1;
(c) selecting word lines WLS1($i$−1) and WLS2($i$−1) and applying program stage S2;
(d) selecting word lines WLS1($i$+2) and WLS2($i$+2) and applying program stage S1;
(e) selecting word lines WLS1($i$−1) and WLS2($i$−1) and applying program stage S2;
(f) selecting word lines WLS1($i$−1) and WLS2($i$−1) and applying program stage S3;
(g) selecting word lines WLS1($i$+3) and WLS2($i$+3) and applying program stage S1;
(h) selecting word lines WLS1($i$−1) and WLS2($i$−1) and applying program stage S2;
(i) selecting word lines WLS1($i$−1) and WLS2($i$−1) and applying program stage S3;
(j) repeating (g), (h) and (i) until i+3 in step (i) is greater than N, then selecting WLS1(N) and WLS2(N) and applying program stage S2;
(k) selecting word lines WLS1(N−1) and WLS2(N−1) and applying program stage S3; and
(l) selecting word lines WLS1(N) and WLS2(N) and applying program stage S3.

\* \* \* \* \*

UNITED STATES PATENT AND TRADEMARK OFFICE
CERTIFICATE OF CORRECTION

PATENT NO. : 10,381,094 B2  
APPLICATION NO. : 15/290376  
DATED : August 13, 2019  
INVENTOR(S) : Chen-Jun Wu et al.

Page 1 of 1

It is certified that error appears in the above-identified patent and that said Letters Patent is hereby corrected as shown below:

In the Claims

In Claim 1, Column 14, Line 49 replace "Si" with --S1--.

In Claim 2, Column 14, Line 55 replace "Si" with --S1--.

In Claim 6, Column 15, Line 59 replace "Si" with --S1--.

In Claim 7, Column 15, Line 64 replace "Si" with --S1--.

In Claim 10, Column 16, Line 56 replace "Si" with --S1--.

Signed and Sealed this  
Fifteenth Day of October, 2019

Andrei Iancu  
*Director of the United States Patent and Trademark Office*